United States Patent
Breme

(10) Patent No.: US 7,820,018 B2
(45) Date of Patent: Oct. 26, 2010

(54) PROCESS AND APPARATUS FOR APPLYING OPTICAL COATINGS

(75) Inventor: Frank Breme, Hausen am albis (CH)

(73) Assignee: Satisloh AG, Baar (CH)

( * ) Notice: Subject to any disclaimer, the term of this patent is extended or adjusted under 35 U.S.C. 154(b) by 1081 days.

(21) Appl. No.: 11/266,888

(22) Filed: Nov. 4, 2005

(65) Prior Publication Data
US 2006/0096852 A1 May 11, 2006

(30) Foreign Application Priority Data
Nov. 5, 2004 (EP) ................................. 04 026 247

(51) Int. Cl.
*C23C 14/34* (2006.01)
(52) U.S. Cl. ............................. 204/192.26; 204/192.12; 204/192.15; 204/192.16; 204/192.23
(58) Field of Classification Search ............ 204/192.12, 204/192.15, 192.16, 192.23, 192.26, 192.27, 204/192.28
See application file for complete search history.

(56) References Cited

U.S. PATENT DOCUMENTS 3,537,973 A * 11/1970 Laib ...................... 204/298.26
4,737,379 A * 4/1988 Hudgens et al. ............. 427/575
6,277,507 B1 8/2001 Anzaki et al.
2005/0040034 A1 2/2005 Landgraf et al.

FOREIGN PATENT DOCUMENTS

| EP | 1 092 787 A2 | 4/2001 |
| JP | 2001073130 A | 3/2001 |
| WO | WO 03/048406 A2 | 6/2003 |

OTHER PUBLICATIONS

*Deposition of Gold-Containing Siloxane Thin Films*, F. Fracassi et al., Elsevier Science S.A., 1996, pp. 60-63.

* cited by examiner

*Primary Examiner*—Rodney G McDonald
(74) *Attorney, Agent, or Firm*—Alston & Bird LLP

(57) ABSTRACT

A process and apparatus for applying an optical coating to a substrate, wherein a transition layer 12, which is used to match mechanical properties of a substrate 10 to mechanical properties of a layer system 16 to be applied upon the transition layer 12, is deposited on a front surface 20 of the substrate 10. For this purpose, during a sputtering process carried out in a vacuum chamber 18, reaction products 14 are incorporated at least virtually exclusively in the transition layer 12 on the substrate. This prevents other surfaces of the vacuum chamber 18 and the rear side 34 of the substrate 10 from being contaminated with the reaction products 14 and/or their precursors.

14 Claims, 1 Drawing Sheet

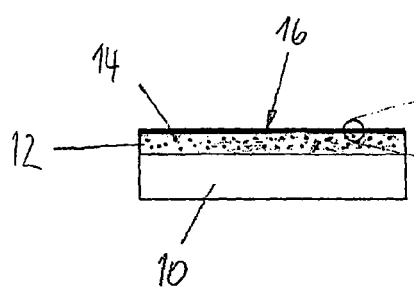
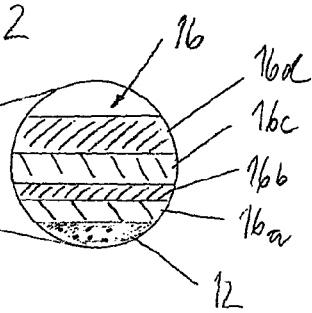
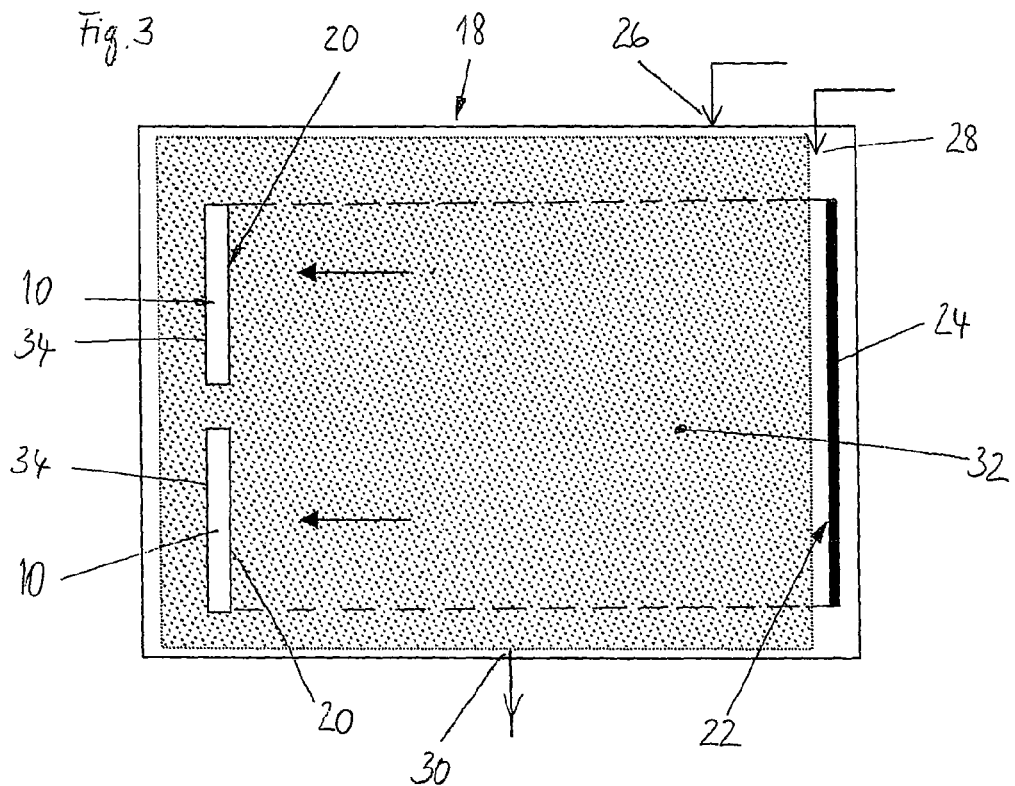

PROCESS AND APPARATUS FOR APPLYING OPTICAL COATINGS

BACKGROUND OF THE INVENTION

The invention relates to a process and an apparatus for applying an optical coating to a front surface of a substrate located in a vacuum chamber.

A range of vacuum coating processes are used to produce optical coatings, for example for antireflection and mirror coatings, optical filters and other treatments of substrate surfaces. The vacuum coating processes carried out in a vacuum chamber include, inter alia: vapor deposition (VD), chemical vapor deposition (CVD) and sputtering (physical vapor deposition—PVD).

During vapor deposition, first of all a coating material is melted and vaporized by means of a heater or electron beam bombardment. The material in the vapor phase then condenses on a cooler surface of the substrate which is to be coated, where it forms a layer. However, deposits are also formed on other surfaces of the vacuum chamber which are accessible to the vapor phase.

Unlike in the case of physical vapor deposition processes, in the CVD process a solid component which is initially in a vapor phase is deposited on the surface of the substrate as a result of a chemical reaction. The precondition for this is for a compound having the desired properties to exist in a vapor phase which under defined conditions, for example with a defined reaction partner, is deposited as a solid layer. One specific type of the CVD process is plasma-enhanced CVD. In this variant, a plasma is generated above the substrate surface to be coated. Some of the components within the vapor which is introduced are brought into a chemically reactive state in the plasma, so that they are capable of undergoing a chemical reaction in the vicinity of the substrate surface, which leads to a solid layer building up.

The term sputtering is used to describe removal of material by ion bombardment, during which extremely small particles of a bombarded solid-state target are detached (sputtered) and, if appropriate after reaction with sputtering gases present in the vacuum chamber, condense on a front surface located directly opposite the target, of a substrate, resulting in the formation of a solid layer. Sputtering is a predominantly physical coating process with a directional characteristic caused by the ion bombardment, in which coating is carried out only in regions which directly face the target, in particular the front surface of the substrate.

The above mentioned coating processes are typically used to apply layers of inorganic materials, which often have ceramic properties. However, inorganic layers have the drawback of generally being very brittle, which means that they are of only limited suitability, for example, for application to plastic substrates with different mechanical and/or thermal properties, in particular an elasticity and expansion coefficient which are different from those of the inorganic layer. This plays a role in particular for plastic spectacle lenses or watch faces, where antireflection coatings and/or scratch-proof layers are exposed to high mechanical and thermal stresses and have to satisfy high demands in terms of the optical quality. Major differences in the mechanical and/or thermal properties of the substrate and functional layer lead to reduced adhesion and possibly even to the layers flaking off. Layers flaking off spectacle lenses, for example, may lead to vision being impaired when wearing the spectacles.

To solve this problem, it is known to seal plastic surfaces by means of what are known as hard lacquers by wet-chemical processes, so as to harden them. After the surface has been conditioned in this way, a further optical layer or a layer system is then applied to the hard lacquer layer, for example by one of the vacuum coating processes mentioned above. However, these hard lacquer coating operations are very technically complex, produce only a low yield of optically perfect hard lacquer layers and have a relatively low resistance to abrasion and weathering compared to the inorganic layers applied by means of vacuum coating processes, such as oxide or nitride layers. Furthermore, a two-stage production process of this type entails increased costs on account of possible surface contamination and more complex handling techniques.

An alternative solution approach, which makes do without a separately applied hard lacquer layer, is known from EP-A-0870070 and corresponding U.S. Pat. No. 6,130,002. In this case, in a plasma-enhanced CVD process, organometal monomers in a vapor phase are introduced into the vacuum chamber in addition to the reactive gases oxygen and nitrogen and are incorporated into the layer as it is being built up. The organometal monomer hexamethylenedisiloxane (HMDSO) is used to produce an organically modified oxide, oxynitride or nitride layer. Preferred application areas for this process include film coatings, window and mirror coatings and coatings for decorative surfaces and exterior cladding applications.

A disadvantage which has emerged with plasma-enhanced CVD processes is that not only the desired surfaces of a substrate but also other surfaces in the vacuum chamber, in particular including rear sides of the substrates, are coated or contaminated in an uncontrolled way. This occurs at least because the process conditions are selected in such a way that the reactive gas reacts chemically at the surfaces. Accordingly, time-consuming and expensive cleaning work has to be carried out on the vacuum chamber during the production process. Since uncontrolled coating of the rear side affects the optical quality of the end product, CVD processes of this type cause problems with the production of optical elements.

The process described in EP-A-0870070 and U.S. Pat. No. 6,130,002 produces a certain localization on surfaces to be coated, by generating a high-density plasma zone immediately in front of the surface to be coated, and by targeted passage of reactive gases and monomers on to the surface to be coated. However, this process is technically complex and does not sufficiently prevent contamination of the vacuum chamber and uncontrolled coating of the rear side of the substrates.

The object of the present invention is to provide a process and an apparatus for producing coatings which allow a layer with defined mechanical properties to be applied to a front surface of a substrate with little contamination of a vacuum chamber.

SUMMARY OF THE INVENTION

The process according to the invention and the apparatus according to the invention are used to apply an optical transition layer to a front surface of a substrate. The transition layer is intended to match mechanical properties of the substrate to mechanical properties of layers or layer systems which are to be applied above the transition layer. This produces compatibility between the materials of the substrate and the layers above it in terms of their elasticity, hardness and thermal properties.

Sputtering forms the basic process for the application of the transition layer. Sputtering offers the advantage of quickly building up the layer in combination with an excellent directional characteristic, with the result that contamination of the vacuum chamber is substantially prevented. During the sputtering operation used to build up the transition layer, precursors whereof the reaction products, in the state in which they are incorporated in the transition layer, alter the mechanical properties of the transition layer are introduced into the vacuum chamber. The concentration of the precursors, which are in a vapor phase, in the vacuum chamber is set in such a manner that the deposition of reaction products and/or precursors without a simultaneous sputtering operation, i.e. as part of the CVD process, is substantially prevented or does not take place. This means that, with regard to the reaction products and precursors, without a sputtering operation taking place adsorption and desorption are in equilibrium, whereas during the sputtering operation the desorption is impeded and/or adsorption promoted on the regions which lie opposite the target, in particular the surfaces which are to be coated. In this way, reaction products and/or precursors are deposited in a targeted way and at least virtually exclusively in the region lying opposite the target, in particular on the front surfaces of the substrates; there is much less contamination of the surrounding surfaces in the vacuum chamber and the rear side of the substrate.

If appropriate, further coatings can be applied by sputtering in the vacuum chamber without transferring the substrate. By way of example, it is possible to apply the transition layer and then an Si oxide/Si nitride layer system for antireflection coating on spectacle lenses or watch faces in a single operation using the same target, for example an Si target. A process of this type for applying protective and antireflection layers is described, for example, in EP-A-1275751 and U.S. Pat. No. 6,878,243.

The apparatus according to the invention and the process according to the invention therefore produce a high-quality coating, in particular even for optical components, using a time-saving and cost-saving production process. Unlike the prior art, this is not a purely chemical process, but rather a combination of physical sputtering with a pronounced directional characteristic and the chemically reactive incorporation of reaction products in the transition layer.

BRIEF DESCRIPTION OF THE DRAWINGS

Particularly preferred embodiments of the process according to the invention and of the apparatus according to the invention are described below with reference to the drawings, in which in detail and purely diagrammatically:

FIG. 1 is a side view of a cross section through a coated substrate with a transition layer in which reaction products are incorporated;

FIG. 2 is a detail illustration of the substrate shown in FIG. 1 with a transition layer and an antireflection layer system applied above it; and FIG. 3 is a plan view of an apparatus according to the invention with two substrates and a target in a vacuum chamber.

DETAILED DESCRIPTION OF THE PREFERRED EMBODIMENTS

FIG. 1 shows a substrate 10 with a coating which has been produced using the process according to the invention or by means of the apparatus according to the invention. A transition layer 12 (also referred to as a hard layer), in which reaction products 14 formed from precursors are incorporated, has been produced directly above the substrate 10. The reaction products 14 are used to match the mechanical and thermal properties of the substrate 10 to the mechanical and thermal properties of an antireflection layer system 16 above it. This ensures that the substrate 10 is mechanically compatible with the layer system 16. An increased elasticity and therefore improved matching of the transition layer 12 prevents the generally very brittle, inorganic layer system 16 from becoming detached. Therefore, the transition layer performs a bridging function between the substrate 10 and the layer system 16.

The transition layer 12 which is shown in FIG. 1, has been applied to a substrate 10 made from plastic and is surrounded in sandwich fashion, predominantly comprises $SiO_2$ and is approximately 500 nm thick. The antireflection layer system 16 above this transition layer 12, which is illustrated in detail in FIG. 2, is approximately 214 nm thick and comprises an approximately 33 nm thick $SiN_y$ layer 16a, an approximately 22 nm thick $SiO_x$ layer 16b, a further, approximately 66 nm thick $SiN_y$ layer 16c and a further, approximately 94 nm thick $SiO_x$ layer 16d. Since the same target material silicon and the sputtering gases oxygen and nitrogen were used during the production of the transition layer 12 and the layer system 16, the layers 12, 16a, 16b, 16c, 16d have been deposited in succession in a single operation without the substrate 10 having to be moved.

The process used to apply the antireflection coating is described, for example, in the above-referenced EP-A-1275751 and U.S. Pat. No. 6,878,243. In addition to the coating of a plastic substrate 10 as shown here, it is also possible for other substrate materials, for example glass, metals or ceramic materials, to be coated in this manner. Furthermore, a defined concentration gradient of reaction products 14 can be produced in the transition layer 12 during the coating operation by varying the precursor concentration, in order to further optimize the compatibility between substrate 10 and layer system 16.

FIG. 3 provides a purely diagrammatic illustration of a plan view of the apparatus according to the invention. In the interior of a vacuum chamber 18 formed by walls, there are two substrates 10, the front surfaces 20 of which, directed into the interior of the vacuum chamber 18, lie at least virtually parallel opposite a target surface 22 of a target 24. The distance between the front surfaces 20 and the target surface, depending on the substrate, is between 50 mm and 150 mm, preferably between 90 mm and 120 mm.

The exemplary embodiment illustrated uses an Si target. Of course, it is also possible to use other materials which are suitable for sputtering. On the target surface side, an apparatus which is not shown is used to bombard the target 24 with ions. This can take place in a way which is known for conventional sputtering processes, for example by means of a DC voltage gas discharge or by means of a magnetron positioned at the target 24 and operated in pulsed mode.

In the vicinity of the target surface 22, a plasma which contains ions of the sputtering gases is produced in a sputtering gas, in this embodiment argon and oxygen, introduced into the vacuum chamber 18 through a sputtering gas inlet 26. In an electromagnetic field, the ions are accelerated toward the target surface 22. When the ions strike the target surface 22, (Si) atoms are removed from the target 24. Depending on the conservation of momentum, the atoms which have been removed move substantially perpendicularly away from the target surface 22 on to the front surface 20 of the substrate 10 and thereby produce a directional dependency in the coating process during sputtering. On their way, they are oxidized by the oxygen, in the present case to form $SiO_2$ and are then deposited on or above the front surface 20 of the substrate 10.

In addition to the sputtering gas inlet 26 for the introduction of the sputtering gas, the vacuum chamber 18 also has at least one precursor inlet 28 and an outlet 30.

The precursors of the reaction products 14, which are in a vapor phase, are fed to the vacuum chamber 18 via the precursor inlet 28. By interaction with the outlet 30, which is connected to a vacuum pump, the concentration of the precursors and their associated partial pressure are set by means of a control apparatus (not shown). In the present embodiment, the precursor used is hexamethylenedisiloxane (HMDSO). As an alternative, it is also possible to use other substances or substance mixtures which are in a vapor phase, preferably organometal substances. In this embodiment, with a vacuum chamber 18 of a size of 10 dm$^3$, the flow rate of the precursor HMDSO is set to approximately 5 sccm (standard cubic centimeters/min) corresponding to 0.3 liters/h [s.t.p.], which leads to a partial pressure of the precursors in the vacuum chamber 18 of $1.5 \cdot 10^{-2}$ Pa. At such a low partial pressure or such a low concentration of precursors, it is virtually exclusively the front surfaces 20 of the substrates 10, lying directly opposite the target surface 22, which are coated with incorporation of the reaction products 14. The low concentration of precursors also means that if ion bombardment is absent, for example if the plasma is missing on account of the gas discharge being switched off, the magnetron not operating and/or a lack of sputtering gases, adsorption and desorption processes are in equilibrium throughout the entire vacuum chamber 18, and there can be no incorporation or effective deposition in the sense of contamination with precursors or the reaction products 14 thereof.

Only during sputtering and therefore while the transition layer 12 is being built up is this equilibrium shifted at least virtually exclusively in the region lying opposite the target 24, in particular on or in front of the front surfaces 20, in such a manner that net deposition of the reaction products 14 occurs as a result of impeded desorption or promoted absorption, with the result that the reaction products 14 are incorporated in the transition layer 12. Furthermore, an equilibrium between adsorption and desorption processes continues to prevail on all surfaces which do not lie opposite the target 24 or the target surface 22, and at these surfaces there is no or only reduced deposition or contamination.

Based on the directional dependency of the coating processes during sputtering, the process according to the invention or the apparatus according to the invention has a pronounced directional characteristic as seen from the target surface 22 toward the front surfaces 20, which advantageously makes it possible to prevent undesired deposits of precursors or reaction products 14, in particular including on the rear sides 34 of the substrates 10. Uncontrolled coating of the rear side would lead to partially unsatisfactory bonding strengths on the rear sides 34, so that subsequent application of further layers or layer systems to the defective rear side coating overall results in coatings of inadequate quality.

The method according to the invention for operating the above-described apparatus initially also requires the preparation work required for known vacuum coating processes, i.e. mainly cleaning of the vacuum chamber 18, conditioning/cleaning of the substrate surfaces, securing/orienting of substrate 10 and target 24, closing of the vacuum chamber 18 and its subsequent evacuation. Then, the coating according to the invention is effected by applying the transition layer 12 to the front surface 20 of the substrate 10, with inclusion of the reaction products 14, in order to match the mechanical properties of the layer system 16 which is subsequently applied to the mechanical and/or thermal properties of the substrate 10. During sputtering, the transition layer 12, with the inclusion of the reaction products 14, is deposited at least virtually exclusively on the front surface 20. During this process step, the partial pressure of the precursors in the vacuum chamber 18 is set in a range from $1 \cdot 10^{-3}$ Pa to $1 \cdot 10^{-1}$ Pa, preferably to $1.5 \cdot 10^{-2}$ Pa, so that deposition of reaction products 14 and their precursors within the vacuum chamber 18 is prevented without ion bombardment of the target surface 22. As soon as the transition layer 12 is completed, it is possible to apply the layer system 16 without the need for complex and expensive transfer of the substrate 10.

A number of load tests have been carried out on substrates 10 which have been coated with a transition layer 12 using the process according to the invention and then provided with an antireflection layer system 16. For these tests, a transition layer 12 was in each case applied to an object A using the following process parameters:

incoming gas flow rates: 25 scam of argon, 15 sccm of oxygen, 5 sccm of HMDSO, resulting in an HMDSO partial pressure of $1.5 \cdot 10^{-2}$ Pa;

pulsed DC sputtering with an electric power of 1.5 kW and a pulse frequency of 90 kHz, with the plasma on time during the pulses amounting to 6 ms;

Si target 24;

time for applying the transition layer 12 300 ms, resulting in a thickness of the transition layer 12 of 430 nm;

distance between the Si target 24 and the substrate 10 105 mm.

Then, identical antireflection layer systems 16 were deposited on the object A and a reference object B, with an identical substrate 10 but without the transition layer 12. The coatings were then damaged in a defined way by means of a standard tool such that four strips of wedge-shaped grooves running parallel to one another at a distance of 1 mm were scratched into the coatings. The object A and the associated reference object B were then subjected to a rapid aging test, in which loading typical of two years of normal use was simulated by 10 days of rapid aging. For this purpose, in a test chamber, the objects were switched at 4-hourly intervals from 1. a temperature of 55° C. and an atmospheric humidity of 95% to
2. a temperature of 50° C. without atmospheric humidity but with irradiation with UVB light of an intensity of 0.83 W/m$^2$/nm.

It was possible to determine removal of materials from the coatings by a visual inspection by means of a standardized adhesive tape test (ASTM D 3359: Standard Test Methods for Measuring Adhesion by Tape Tests), in which adhesive tapes were stuck over the damaged regions and then pulled off. In these tests, it was concluded that the objects A provided with a transition layer 12 in accordance with the invention did not have any additional damage or removal of layer elements. By contrast, approximately 30% of the coatings of the reference object B had become detached, and the remaining coating revealed further crack formations. This demonstrated the function and advantageous action of the process according to the invention involving the application of a transition layer 12.

A typical area of use for the present apparatus and the present process is the coating of spectacles lenses and/or watch faces made from plastic or glass. However, neither the process nor the apparatus is restricted to the conventional fields of optics and manufacture of scientific apparatus, but rather can also be used in other fields, for example packaging technology and energy technology, for example in connection with solar cells.

Many modifications and other embodiments of the invention set forth herein will come to mind to one skilled in the art to which the invention pertains having the benefit of the teachings presented in the foregoing description and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A process for applying optical coatings to a front surface of a substrate located in a vacuum chamber by means of a sputtering operation which includes an ion-enhanced atomization of a target, and comprising depositing a transition layer on the front surface, which serves in particular to match mechanical properties of the substrate to the mechanical properties of the layers or layer systems to be later applied to it, and including introducing in a vapor phase one or more precursors whose reaction products, in the state in which they are incorporated in the transition layer alter the mechanical properties of the transition layer, into the vacuum chamber before and/or during the deposit of the transition layer, with the concentration of the precursors in the vacuum chamber being selected in such a manner that the deposition of reaction products and/or precursors without a simultaneous sputtering operation is substantially precluded, and that, during the sputtering operation, reaction products and/or precursors are deposited virtually exclusively on the front surface of the substrate which lies opposite the target.

2. The process as claimed in claim 1, wherein the one or more precursors used are selected from the group consisting of polymerizable hydrocarbons, organometal compounds, organosilicon compounds, organofluorine compounds and/or mixtures thereof.

3. The process as claimed in claim 1, wherein the one or more precursors used include hexamethylenedisiloxane (HMDSO), whose partial pressure in the vacuum chamber is set to a range from $1 \cdot 10^{-3}$ Pa to $0.5 \cdot 10^{-1}$ Pa.

4. The process as claimed in claim 1, wherein the substrate is optically transparent and comprises plastic or glass.

5. The process as claimed in claim 1, wherein a further layer or a further layer system is deposited upon the transition layer by means of sputtering and/or another coating process.

6. The process as claimed in claim 5, wherein the further layer or layer system comprises an antireflection layer or antireflection layer system.

7. The process as claimed in claim 1, wherein sputtering gases are introduced into the vacuum chamber for the sputtering operation.

8. The process as claimed in claim 7, wherein the sputtering gases comprise oxygen and/or nitrogen.

9. The process as claimed in claim 1, wherein the material of the target comprises silicon.

10. An apparatus for carrying out the process of claim 1, comprising
an evacuable vacuum chamber having provision for mounting a target and at least one substrate in an opposing but spaced apart arrangement within the chamber,
means for bombarding the target with ions, and
a precursor inlet for admitting a predetermined concentration of one or more precursors into the chamber.

11. The apparatus as claimed in claim 10, wherein the substrate has a front surface which faces the target, and wherein the distance between the front surface and the target is between 50 mm and 150 mm.

12. The process as claimed in claim 3, wherein the partial pressure in the vacuum chamber is set to approximately $1.5 \cdot 10^{-2}$ Pa.

13. A process for applying an optical coating to a front surface of a substrate, comprising the steps of
depositing a transition layer virtually exclusively on the front surface of the substrate by means of a sputtering operation which includes the ion bombardment of a target in a vacuum chamber which also encloses the substrate, then
depositing a layer or layer system upon the transition layer to form an outer optical coating,
wherein the step of depositing a transition layer includes the introduction of one or more precursors in a vapor phase into the vacuum chamber which form reaction products in the transition layer which serve to at least substantially match the mechanical and/or thermal properties of the outer optical coating to those of the substrate, with the partial pressure of the precursors in the vacuum chamber being selected at a level wherein the deposit of the precursors and their reaction products would be essentially precluded without ion bombardment of the target.

14. The process as claimed in claim 13, wherein the step of depositing a layer or layer system upon the transition layer comprises a second sputtering operation conducted in the vacuum chamber without moving the substrate.

* * * * *

UNITED STATES PATENT AND TRADEMARK OFFICE
CERTIFICATE OF CORRECTION

| | | |
|---|---|---|
| PATENT NO. | : 7,820,018 B2 | Page 1 of 1 |
| APPLICATION NO. | : 11/266888 | |
| DATED | : October 26, 2010 | |
| INVENTOR(S) | : Breme | |

It is certified that error appears in the above-identified patent and that said Letters Patent is hereby corrected as shown below:

Column 6,
Line 17, "25 scam" should read --25 sccm--.

Signed and Sealed this
Thirty-first Day of January, 2012

David J. Kappos
*Director of the United States Patent and Trademark Office*